United States Patent
Park

(10) Patent No.: US 12,170,285 B2
(45) Date of Patent: Dec. 17, 2024

(54) DISPLAY DEVICE AND MANUFACTURING METHOD THEREFOR

(71) Applicant: TOVIS CO., LTD., Incheon (KR)

(72) Inventor: Yong Min Park, Gyeonggi-do (KR)

(73) Assignee: TOVIS CO., LTD., Incheon (KR)

( * ) Notice: Subject to any disclaimer, the term of this patent is extended or adjusted under 35 U.S.C. 154(b) by 309 days.

(21) Appl. No.: 17/782,053

(22) PCT Filed: Nov. 16, 2020

(86) PCT No.: PCT/KR2020/016069
§ 371 (c)(1),
(2) Date: Jun. 2, 2022

(87) PCT Pub. No.: WO2021/112445
PCT Pub. Date: Jun. 10, 2021

(65) Prior Publication Data
US 2023/0005967 A1    Jan. 5, 2023

(30) Foreign Application Priority Data

Dec. 4, 2019  (KR) ........................ 10-2019-0159633

(51) Int. Cl.
*H01L 27/12* (2006.01)
*G02F 1/1368* (2006.01)
(Continued)

(52) U.S. Cl.
CPC ........ *H01L 27/1218* (2013.01); *G02F 1/1368* (2013.01); *G02F 1/133514* (2013.01); *G02F 1/13452* (2013.01); *G02F 2201/56* (2013.01)

(58) Field of Classification Search
CPC ........... H01L 27/1218; H01L 21/30604; G02F 1/133305; G02F 1/1368; G02F 1/13452;
(Continued)

(56) References Cited

U.S. PATENT DOCUMENTS

2019/0137800 A1    5/2019  Lee et al.
2022/0026756 A1*   1/2022  Hwangbo ......... G02F 1/133305

FOREIGN PATENT DOCUMENTS

KR   10-2011-0016795     2/2011
KR   10-2014-0053774     5/2014
(Continued)

OTHER PUBLICATIONS

English translation of PCT/KR2020/0169069 PCT written opinion of the international searching authority filed on Jan. 27, 2024.*
(Continued)

*Primary Examiner* — Hoan C Nguyen
(74) *Attorney, Agent, or Firm* — Ladas & Parry, LLP

(57) ABSTRACT

Provided is a display device. The display device includes an upper substrate; and a lower substrate disposed on a lower portion of the upper substrate and including an outer region extending outward from the upper substrate at one side, wherein each of the upper substrate and the lower substrate includes a protruding region extending along an edge of each of the upper substrate and the lower substrate, and a recessed region surrounded by the protruding region in a plan view and having a thickness smaller than that of the protruding region, wherein the protruding region includes a first protruding region that is adjacent to the outer region and extends in a first direction, a second protruding region that extends in the first direction and is positioned opposite to the first protruding region, a third protruding region that extends in a second direction intersecting the first direction and connects the first protruding region and the second protruding region, and a fourth protruding region that extends in the second direction and is positioned opposite to the third protruding region, wherein the first protruding region includes a 1-1 protruding region, and the 1-1 protruding region includes a 1-1-1 protruding region and a 1-1-2 protruding region disposed between the 1-1-1 protruding (Continued)

region and the recessed region and having a thickness between a thickness of the 1-1-1 protruding region and the thickness of the recessed region.

13 Claims, 12 Drawing Sheets

(51) Int. Cl.
  *G02F 1/1335* (2006.01)
  *G02F 1/1345* (2006.01)
(58) Field of Classification Search
  CPC ......... G02F 1/133388; G02F 1/133368; G02F 2201/56; G02F 1/133514; G02F 1/1339; G02F 1/1345; G02F 1/1333; G02F 1/1335; G02F 1/1303; G02F 1/133528; G02F 1/0136; G02F 1/133308; G02F 1/133531; C03B 23/023; B32B 38/10; B32B 37/12; C03C 23/0075; C03C 15/00; G09F 9/00
  See application file for complete search history.

(56) References Cited

FOREIGN PATENT DOCUMENTS

| KR | 10-1658432 | 9/2016 | | |
| KR | 10-1676851 | 11/2016 | | |
| KR | 10-2017-0143355 | 12/2017 | | |
| KR | 10-2019-0047543 | 5/2019 | | |
| KR | 10-2021-0016907 | 2/2021 | | |
| WO | WO-2014065567 A1 | * | 5/2014 | ....... G02F 1/133305 |
| WO | WO-2016104844 A1 | * | 6/2016 | ........... G02F 1/1303 |
| WO | 2016/108296 | 7/2016 | | |

OTHER PUBLICATIONS

Extended European Search Report dated Dec. 4, 2023 for European Patent Application No. 20895009.7.
International Preliminary Report on Patentability for PCT/KR2020/016069 issued on May 17, 2022 and its English Translation from WIPO (now published as WO 2021/112445).
International Search Report for PCT/KR2020/016069 mailed on Feb. 18, 2021 and its English Translation from WIPO (now published as WO 2021/112445).
Written Opinion of the International Searching Authority for PCT/KR2020/016069 mailed on Feb. 18, 2021 and its English Translation by Google Translate (now published as WO 2021/112445).
Notice of Allowance of Korean Application No. 10-2019-0159633, mailed on Feb. 19, 2021, with English Translation by Google Translate.

* cited by examiner

DISPLAY DEVICE AND MANUFACTURING METHOD THEREFOR

CROSS-REFERENCE TO RELATED APPLICATIONS

This application is the national stage of International Patent Application No. PCT/KR2020/016069 filed on Nov. 16, 2020, which claims priority to Korean Patent Application No. 10-2019-0159633 filed in the Korean Intellectual Property Office on Dec. 4, 2019, the disclosures of which are incorporated by reference herein in their entireties.

TECHNICAL FIELD

The present invention relates to a display device and a manufacturing method therefor, and more particularly, to a curved display device having a curved display region and a manufacturing method therefor.

BACKGROUND ART

A display device is an electronic device for displaying an image, and research on a curved display device is being conducted in order to increase an immersion feeling of an image as technology has developed in recent years.

The curved display device provides an immersive feeling because an viewing surface of an image is curved and thus viewers feel as if the viewers are located in a space, and a typical curved display device may be manufactured by bending a display panel after thinly fabricating a thickness of a flat panel display device.

Meanwhile, in order to manufacture the curved display device, the display device may be manufactured by designing a thickness of the display device to be thin at the time of initial fabrication, but otherwise, the curved display device may be manufactured by bending after a process such as etching so as to reduce a thickness of a produced display device.

DISCLOSURE

Technical Problem

One aspect of the present invention provides a display device including double etched portions having different thicknesses on an edge of the display device.

Another object of the present invention provides a display device including double etched portions having different surface heights on an edge of the display device.

Aspects of the present invention are not limited to the aspects mentioned above, and other technical aspects not mentioned above will be clearly understood by those skilled in the art from the following description.

Technical Solution

A display device according to an exemplary embodiment for solving the above problem includes: an upper substrate; and a lower substrate disposed on a lower portion of the upper substrate and including an outer region extending outward from the upper substrate at one side, wherein each of the upper substrate and the lower substrate includes a protruding region extending along an edge of each of the upper substrate and the lower substrate, and a recessed region surrounded by the protruding region in a plan view and having a thickness smaller than that of the protruding region, wherein the protruding region includes a first protruding region that is adjacent to the outer region and extends in a first direction, a second protruding region that extends in the first direction and is positioned opposite to the first protruding region, a third protruding region that extends in a second direction intersecting the first direction and connects the first protruding region and the second protruding region, and a fourth protruding region that extends in the second direction and is positioned opposite to the third protruding region, wherein the first protruding region includes a 1-1 protruding region, and the 1-1 protruding region includes a 1-1-1 protruding region and a 1-1-2 protruding region disposed between the 1-1-1 protruding region and the recessed region and having a thickness between a thickness of the 1-1-1 protruding region and the thickness of the recessed region.

The upper substrate may include a color filter substrate, and the lower substrate may include a thin film transistor substrate.

The display device may further include a flexible film attached on the outer region and a main circuit board connected to the flexible film, wherein the flexible film may be plural, and the plurality of flexible films may be arranged in the first direction.

The 1-1 protruding region may be disposed adjacent to the third protruding region.

The 1-1 protruding region may be further disposed adjacent to the fourth protruding region.

The first protruding region may further include a 1-2 protruding region disposed between the 1-1 protruding region disposed adjacent to the third protruding region and the 1-1 protruding region disposed adjacent to the fourth protruding region, and a thickness of the 1-2 protruding region may be smaller than the thickness of the 1-1-1 protruding region.

In the 1-1-1 protruding region, a thickness of the upper substrate may be greater than a thickness of the lower substrate.

In the 1-1-2 protruding region, the thickness of the upper substrate may be substantially the same as the thickness of the lower substrate.

In the 1-1-1 protruding region, the thickness of the lower substrate may be the same as the thickness of the lower substrate in the 1-1-2 protruding region.

A thickness of the first protruding region may be smaller than each of a thickness of the third protruding region and a thickness of the fourth protruding region.

A thickness of the second protruding region may be smaller than each of the thickness of the third protruding region and the thickness of the fourth protruding region.

A display device according to another exemplary embodiment for solving the above problem includes: a color filter substrate; and a thin film transistor substrate disposed on a lower portion of the color filter substrate and including an outer region extending outward from the color filter substrate at one side, wherein each of the color filter substrate and the thin film transistor substrate includes a protruding region extending along an edge of each of the color filter substrate and the thin film transistor substrate, and a recessed region surrounded by the protruding region in a plan view and having a thickness smaller than that of the protruding region, wherein the protruding region includes a first protruding region that is adjacent to the outer region and extends in a first direction, a second protruding region that extends in the first direction and is positioned opposite to the first protruding region, a third protruding region that extends in a second direction intersecting the first direction and connects the first protruding region and the second protruding region, and a fourth protruding region that extends in the second direction and is positioned opposite to the third protruding region, wherein the first protruding region includes a plurality of protrusions having different surface heights from each other.

The plurality of protrusions may include a 1-1 protruding region, and the 1-1 protruding region may include a 1-1-1 protruding region and a 1-1-2 protruding region disposed between the 1-1-1 protruding region and the recessed region and having a surface height between a surface height of the 1-1-1 protruding region and a surface height of the recessed region.

The 1-1 protruding region may be disposed adjacent to the third protruding region and the fourth protruding region.

The first protruding region may further include a 1-2 protruding region disposed between the 1-1 protruding region disposed adjacent to the third protruding region and the 1-1 protruding region disposed adjacent to the fourth protruding region, wherein a thickness of the 1-2 protruding region may be smaller than a thickness of the 1-1-1 protruding region, and in the 1-1-1 protruding region, a thickness of the color filter substrate may be greater than a thickness of the thin film transistor substrate.

Specific details of other exemplary embodiments are included in the detailed description and the drawings.

Advantageous Effects

A display device according to an exemplary embodiment can include double etching portions having different surface heights and/or thicknesses in an edge portion thereof.

Effects according to exemplary embodiments are not limited by the contents exemplified above, and more various effects are included in the present specification.

MODES OF THE INVENTION

Figure 1:
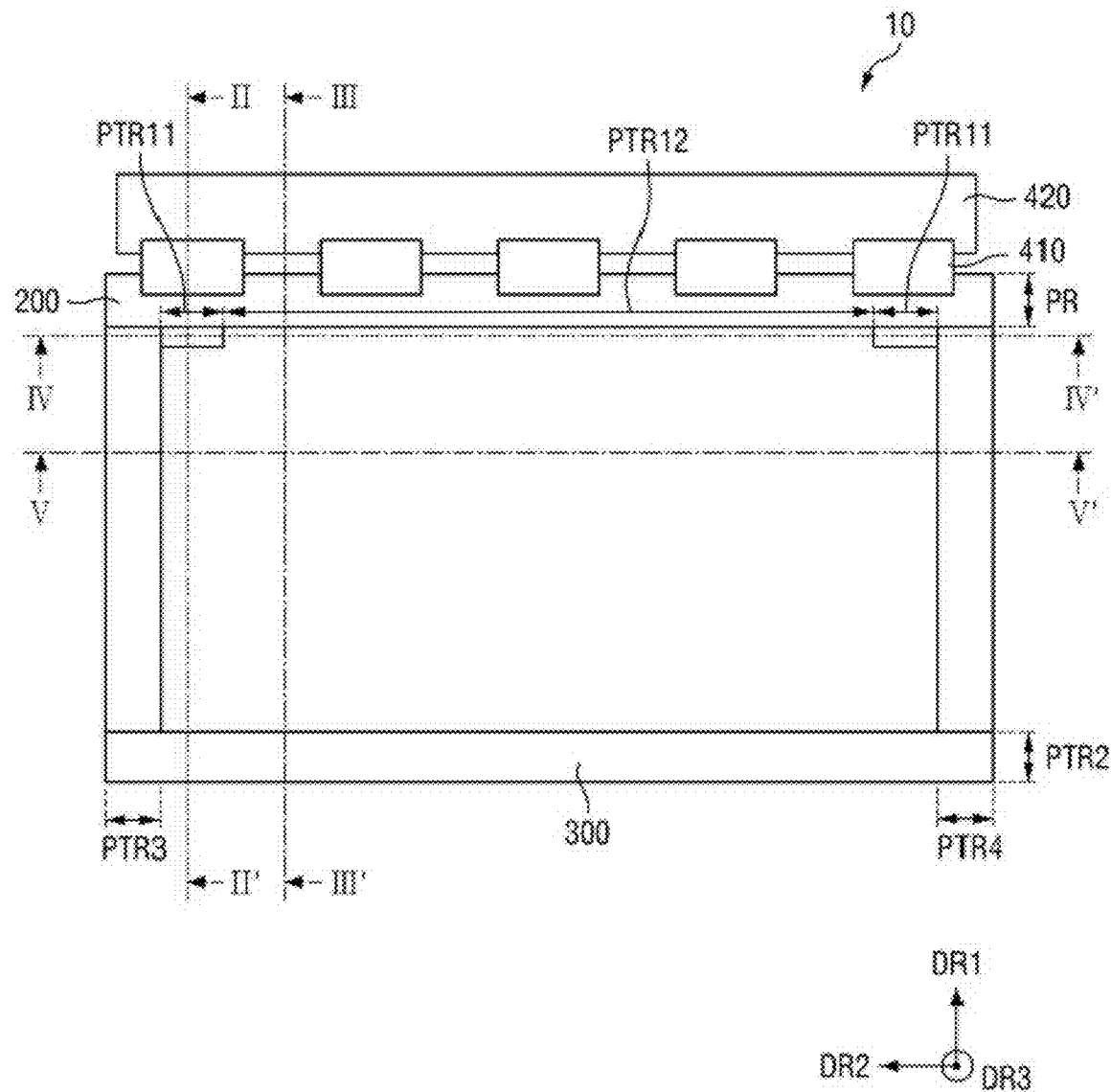
FIG. 1 is a plan layout view of a display device according to an exemplary embodiment.

Advantages and features of the present invention, and methods of achieving the same will be clearly understood with reference to the accompanying drawings and the following detailed embodiments. However, the present invention is not limited to the exemplary embodiments to be disclosed, but may be implemented in various different forms. The exemplary embodiments are provided in order to fully explain the present invention and fully explain the scope of the present invention for those skilled in the art. The scope of the present invention is defined by the appended claims.

Referring that an element or layer is "on" of another element or layer includes all cases in which another layer or element is interposed directly on or in the middle of another element. Like reference numerals refer to like elements throughout the specification.

Although the terms "first," "second," etc. are used to describe various elements, these elements are not limited by these terms. These terms are only used to distinguish one element from another element. Therefore, of course the first element mentioned below may be the second element within the technological scope of the present invention.

Hereinafter, specific exemplary embodiments will be described with reference to the accompanying drawings.

Figure 2:
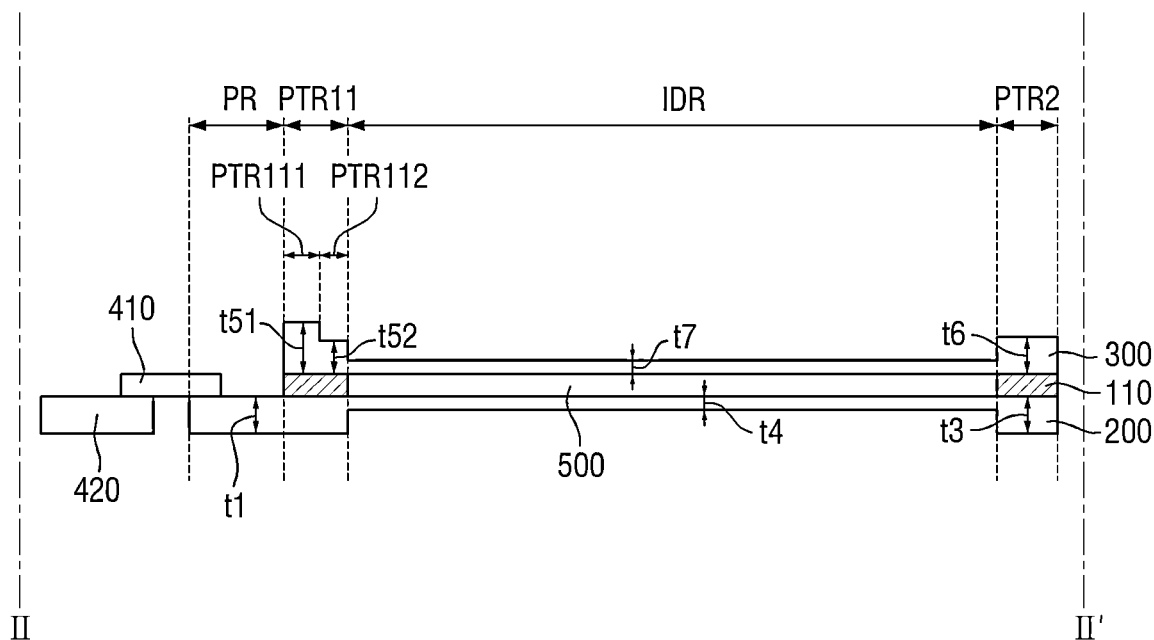
FIG. 2 is a cross-sectional view taken along line II-II' of the display device of FIG. 1.
Figure 3:
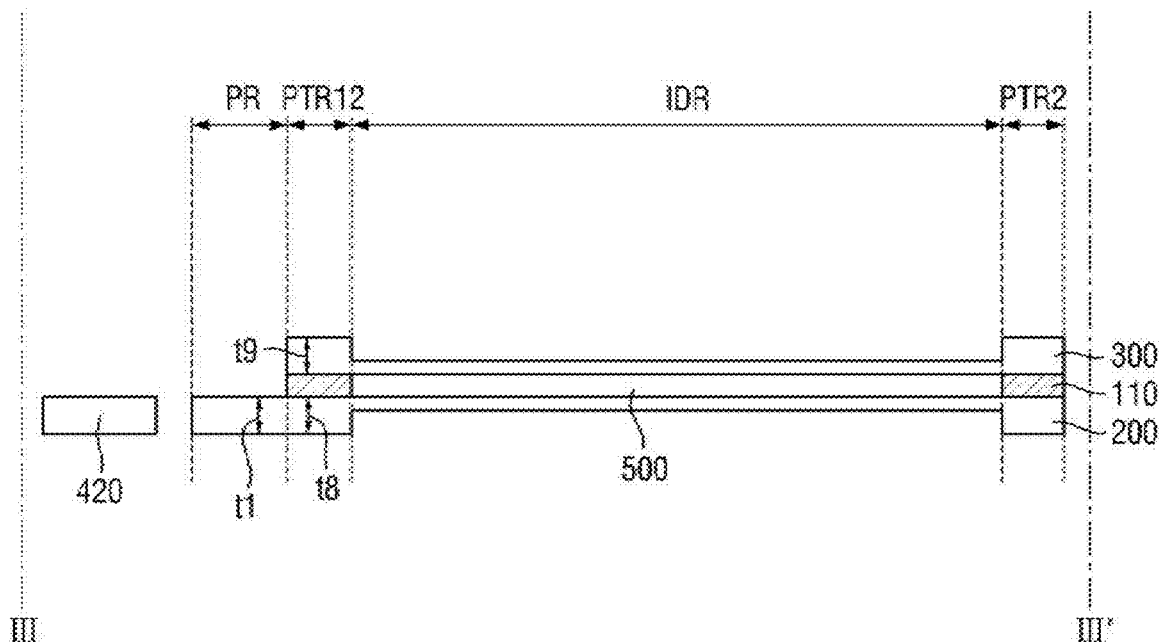
FIG. 3 is a cross-sectional view taken along line III-III' of the display device of FIG. 1.
Figure 4:
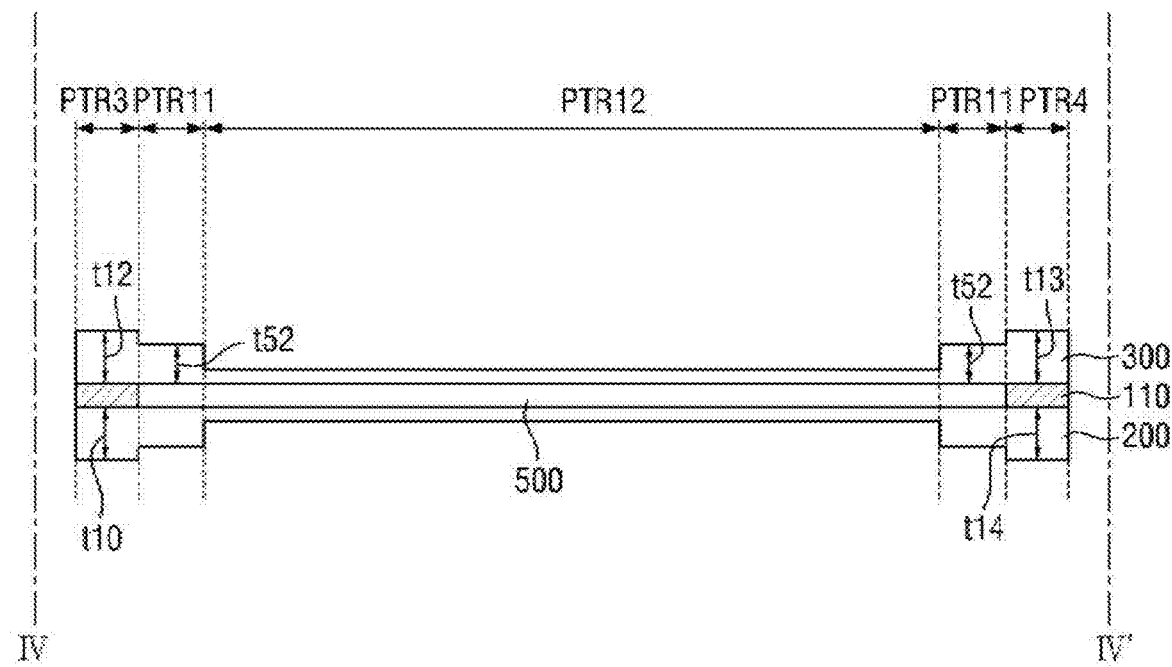
FIG. 4 is a cross-sectional view taken along line IV-IV' of the display device of FIG. 1.
Figure 5:
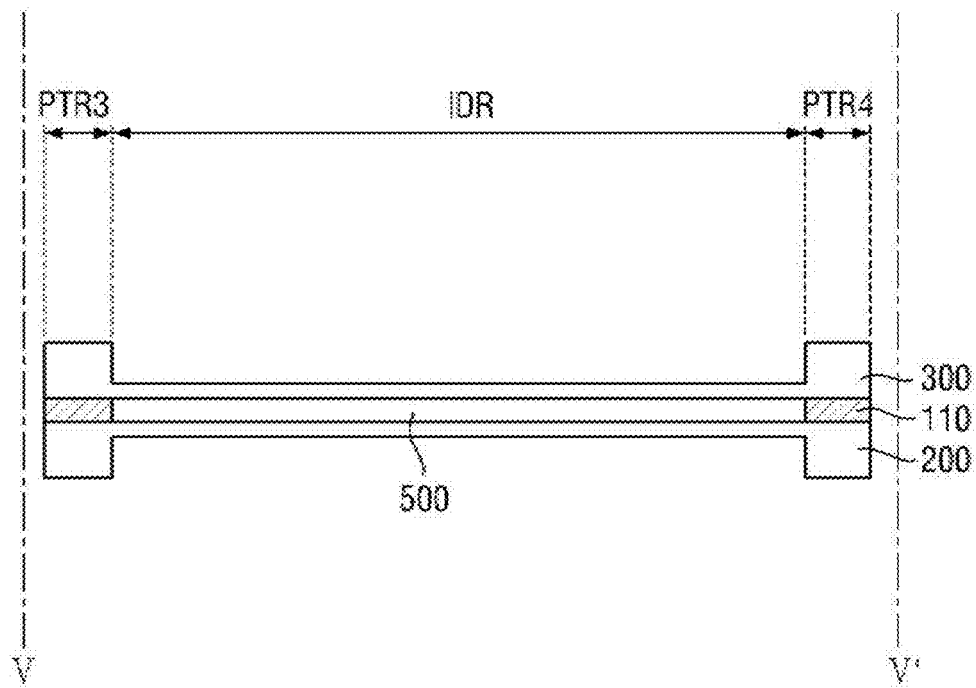
FIG. 5 is a cross-sectional view taken along line V-V' of the display device of FIG. 1.
Figure 6:
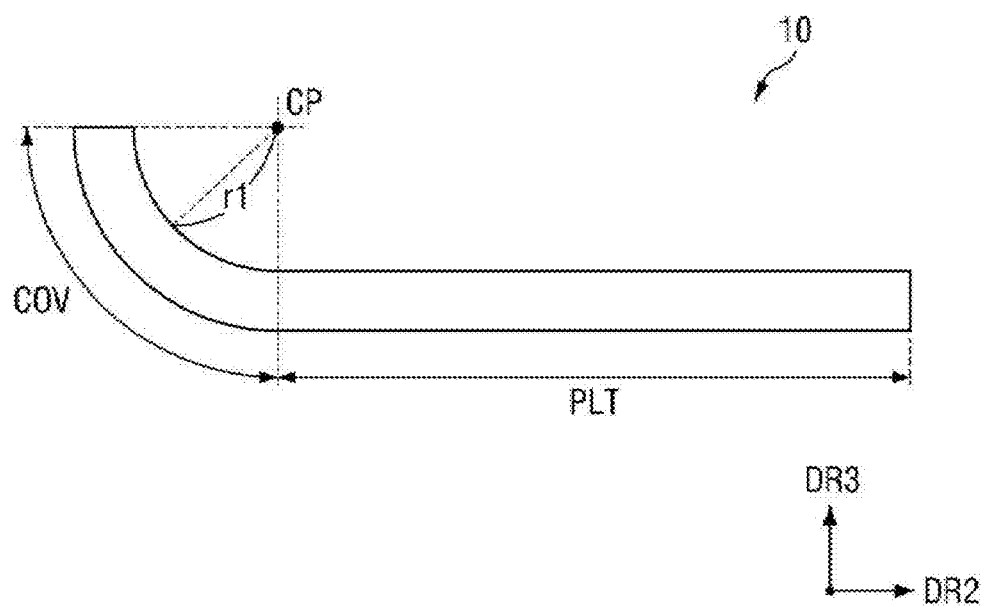
FIGS. 6 to 8 are cross-sectional views illustrating a bent state of the display device of FIG. 1.
Figure 7:
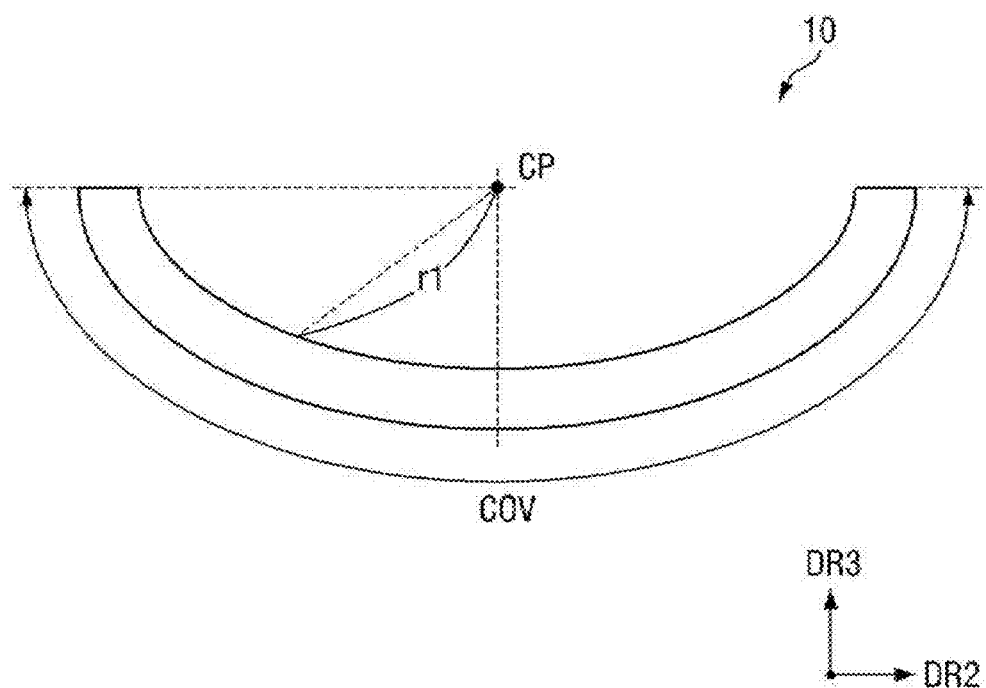
Figure 8:
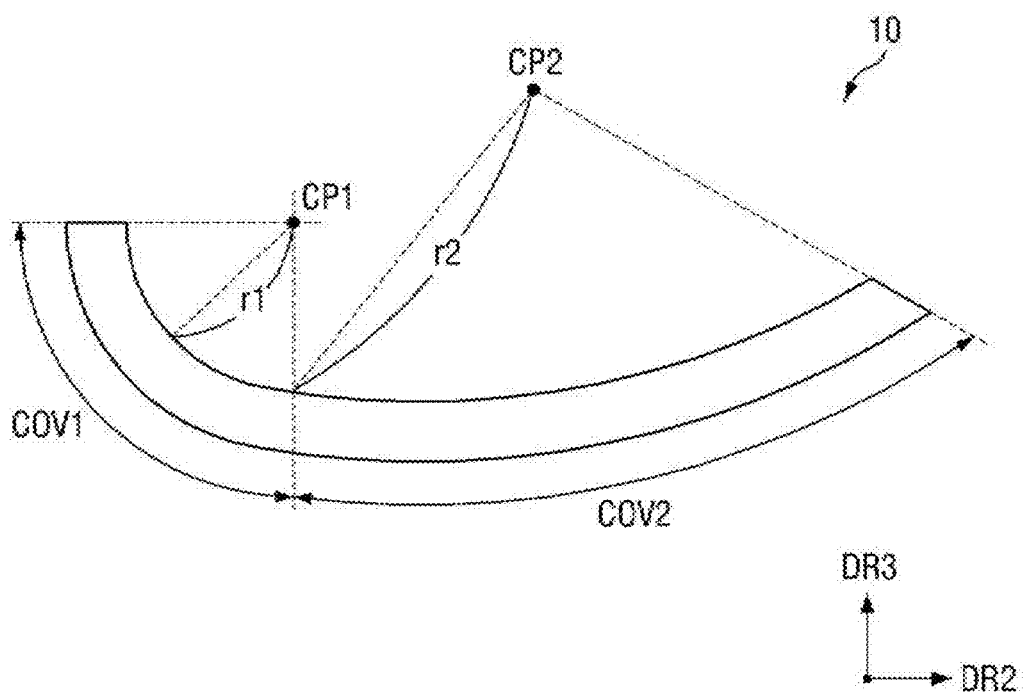

FIG. 1 is a plan layout view of a display device according to an exemplary embodiment. FIG. 2 is a cross-sectional view taken along line II-II' of the display device of FIG. 1. FIG. 3 is a cross-sectional view taken along line III-III' of the display device of FIG. 1. FIG. 4 is a cross-sectional view taken along line IV-IV' of the display device of FIG. 1. FIG. 5 is a cross-sectional view taken along line V-V' of the display device of FIG. 1. FIGS. 6 to 8 are cross-sectional views illustrating a bent state of the display device of FIG. 1. FIG. 1 illustrates an unfolded state of a curved display device.

Referring to FIGS. 1 to 8, when a display device 10 is a device including a display region for displaying an image or video, the display device 10 may be interpreted as corresponding to a display device regardless of a main purpose of the device, an added function, a name, or the like. For example, the display device may include a small game machine, a large game machine such as a slot machine used in a casino, an electronic blackboard, an e-book, a smartphone, a mobile phone, a tablet PC, a personal digital assistant (PDA), a portable multimedia player (PMP), a television, a personal computer monitor, a notebook computer, a car navigation system, a car dashboard, a digital camera, a camcorder, an external billboard, an electric sign, various medical devices, various inspection devices, various home appliances including displays such as refrigerators and washing machines, Internet of Things devices, and the like, but the exemplary embodiment is not limited to the above-described examples.

In the exemplary embodiment, the display device 10 may have a rectangular shape including two long sides facing each other (an upper side and a lower side when viewing a display surface in the drawing) and two short sides facing each other (a left side and a right side when viewing the display surface in the drawing). As shown in FIG. 1, the long side of the display device 10 may be disposed horizontally or may be disposed vertically based on a direction of a normal display screen.

In the drawing, three direction axes are defined. A first direction DR1 may be a short side extension direction of the display device, a second direction DR2 may be a long side extension direction of the display device, and a third direction DR3 may be a thickness direction of the display device. One side in the first direction DR1 may be defined as an upper long side of the display device 10, the other side in the first direction DR1 may be defined as a lower long side of the display device 10, one side in the second direction DR2 may be defined as a left short side of the display device 10, and the other side in the second direction DR2 may be defined as a right short side of the display device 10, but it should be understood that the above-described definition of the direction axis is relative.

Referring to FIGS. 6 to 8, the display device 10 may have a curved shape. That is, a display surface of the display device 10 may include at least one convex or concave curved surface. For example, the display device 10 may include a flat section FLT and a curved section COV as shown in FIG. 6. The flat section FLT may be positioned at a predetermined width from one short side (a left short side of FIG. 1) of the display device 10 in the second direction DR2, and the curved section COV may be disposed from the flat section FLT to the other short side of the display device 10 (a right short side of FIG. 1) in the second direction DR2. In the curved section COV, the display device 10 may have a concave shape toward one side (upper direction) in the third direction DR3. The curved section COV may have the same curvature throughout, and thus may have the same curvature radius r1, but the exemplary embodiment is not limited thereto. In this specification, the 'curvature radius' refers to a distance from a surface forming the curved surface of the display device 10 to a reference point CP or a center. The curvature radius r1 of the curved section COV may be 0.5 m or less. The display device 10 may substantially have a 'J' shape.

As another example, as shown in FIG. 7, the display device 10 may have a curved surface in which a long side is disposed horizontally, a short side is disposed vertically, and the long side is generally curved while the short side maintains a straight line.

A surface of the display device 10 may include a part of a spherical surface or a part of an ellipsoidal surface. A curvature of a curved portion (the curved section COV of FIG. 7) of the display device 10 may be constant. That is, the curved portion of the display device 10 may be placed on a portion (arc) of a circle having a constant radius based on the center. The curvature radius r1 of the display device 10 is not limited thereto, but the curvature radius r1 may be 0.5 m to 5 m or 1 m to 1.5 m.

The curved surface of the display device 10 may include a concave surface that is concavely curved in a display direction when viewing the display surface as shown in FIG. 7.

As still another example, as shown in FIG. 8, the display device 10 may have a curved surface in which a long side is disposed horizontally, a short side is disposed vertically, and the long side is curved while the short side maintains a straight line, and the surface of the display device 10 may include a part of a spherical surface or a part of an ellipsoidal surface. The curved portions of the display device 10 (curved sections COV1 and COV2 of FIG. 8) may include different curvatures. That is, the curved portions of the display device 10 may be placed on portions (arc) of different circles having different radii based on centers CP1 and CP2. A curvature of a first curved section COV1 may be smaller than a curvature of a second curved section COV2. Accordingly, a curvature radius r1 of the first curved section COV1 may be smaller than a curvature radius r2 of the second curved section COV2.

A liquid crystal display (LCD) may be applied as the display device. In the following exemplary embodiments, the liquid crystal display is used as an example of the display device, but the display device is not limited thereto, and the display device may also be applied to an electrophoretic display device (EPD), an organic light-emitting display device (OLED), a micro-LED display device, a plasma display device (PDP), a field emission display device (FED), a cathode ray tube display device (CRT), and the like.

The display device may include a first substrate 200, a second substrate 300 facing the first substrate 200, and a liquid crystal layer 500 interposed between the first substrate 200 and the second substrate 300. A sealing member 110 may be disposed on edges of the first substrates 200 and the second substrates 300 to couple the first substrates 200 and the second substrate 300, and may prevent liquid crystal molecules of the liquid crystal layer ('500' in FIG. 2) from flowing to the outside.

Both the first substrate 200 and the second substrate 300 of the display device may include curved surfaces having the same shape. That is, the display device may include the curved first substrate 200 and the curved second substrate 300.

One of the first substrate 200 and the second substrate 300 may be a thin film transistor substrate, and the other may be a color filter substrate. In this exemplary embodiment, a case in which the first substrate 200 is a thin film transistor substrate and the second substrate 300 is a color filter substrate is exemplified. The display direction may be an outer direction of an upper surface of the second substrate 300. The second substrate 300 may be disposed above the first substrate 100 based on the display direction. Accordingly, the second substrate 300 may be an upper substrate, and the first substrate 200 may be a lower substrate.

The first substrate 200, which is a thin film transistor substrate, may protrude relatively from the second substrate 300. For example, an end portion of one side of the first substrate 200 in the first direction DR1 may protrude further from an end portion of one side of the second substrate 300 in the first direction DR1. The end portion of one side of the first substrate 200 protruding from the second substrate 300 in the first direction DR1 may be defined as an outer region PR. The outer region PR may not overlap the second substrate 300. At least a part of a driving unit for driving each pixel of the thin film transistor substrate may be disposed in a portion where the first substrate 200 protrudes from the second substrate 300 and does not overlap the second substrate 300. For example, the driving unit may include a driving connection film 410 and a driving circuit board 420 connected thereto, and the driving connection film 410 may be attached on the non-overlapping portion of the first substrate 200. That is, the driving connection film 410 may not overlap the second substrate 300.

Although not shown in the drawings, the display device may further include a polarizing film. The polarizing film may be attached to a rear surface of each of the first substrate 200 and the second substrate 300. An attachment region of the polarizing film may be in an etched region (or a recessed region) to be described below, but the exemplary embodiment is not limited thereto.

Each of the first substrate 200 and the second substrate 300 may include an insulating substrate made of glass, quartz, etc. and structures such as a wiring, a metal, a semiconductor layer, an insulating film, a color filter, and a black matrix disposed thereon. Each of the structures may be disposed on one surface in which an insulating substrate of the first substrate 200 and an insulating substrate of the second substrate 300 face each other. In the drawings, the illustration of the structure disposed on the insulating substrate is omitted for convenience, and only the shapes of the insulating substrates of the first substrate 200 and the second substrate 300 are shown. Hereinafter, when referring to a shape of a rear surface of the first substrate 200 or the second substrate 300, the corresponding shape may refer to a shape of a rear surface of the insulating substrate of the first substrate 200 or a shape of a rear surface of the insulating substrate of the second substrate 300. However, the exemplary embodiment is not limited to the above example, and another additional layer may be disposed on the rear surface of the insulating substrate of the first substrate 200 or the second substrate 300, and the corresponding layer may be etched or polished to include protruding or recessed regions.

The driving connection film 410 or a flexible film may be attached to an end portion of one side (i.e., the outer region PR) of the first substrate 200 in the first direction DR1. The driving connection film 410 serves to connect the first substrate 200 and the driving circuit board 420 or a main circuit board or a main circuit substrate. The driving connection film 410 may be attached to one surface 201 of the first substrate 200 with a conductive anisotropic film interposed therebetween. However, the exemplary embodiment is not limited thereto, and the driving connection film 410 may be directly attached to one surface of the first substrate 200 through soldering or ultrasonic bonding. A region where the driving connecting film 410 is attached to the first substrate may be a region overlapping the first protruding region 212. The driving connection film 410 may be a film including a signal line and may include a flexible film. The driving connection film 410 may be a flexible printed circuit board (FPC), a TAB film, a connect film, or the like.

The driving circuit board 420 may be attached to one end of the driving connection film 410. The driving connection film 410 and the driving circuit board 420 may be attached by a conductive anisotropic film interposed therebetween. When soldering or ultrasonic bonding is used for bonding the driving connection film 410 and the driving circuit board 420, a second conductive anisotropic film may be omitted.

The driving circuit board 420 may be formed of a printed circuit board (PCB). A driving chip may be disposed on the driving circuit board 420. In some exemplary embodiments, the driving chip may be disposed on the driving connecting film.

The drawings exemplify a case in which the driving circuit board 420 and the driving connecting film 410 connecting the same are disposed at an end portion of one side of the first substrate 200 in the first direction DR1, but the driving circuit board 420 and the driving connection film 410 may be disposed at an end portion of the other side of the first substrate 200 in the first direction DR1, or at an end portion of one side or the other side of the first substrate 200 in the second direction DR2. In addition, the driving circuit boards 420 and the driving connection film 410 may be provided in plural and attached adjacent to two or more sides of the first substrate 200.

In some exemplary embodiments, one driving circuit board 420 may be connected to the first substrate 200 by the plurality of driving connection films 410. That is, as shown in FIG. 1, the plurality of driving connection films 410 having a width smaller than that of the driving circuit board 420 may be attached to one driving circuit board 420. The adjacent driving connecting films 410 may be spaced apart from each other.

Except for the outer region PR of the display device 10, the first substrate 200 and the second substrate 300 may be disposed to overlap substantially in the thickness direction. A region where the first substrate 200 and the second substrate 300 are disposed to overlap each other may be divided into a plurality of regions according to a thickness or surface height.

A planar shape of the region where the first substrate 200 and the second substrate 300 of the display device 10 are disposed to overlap each other may be a rectangular shape. That is, the rectangular shape may be formed of long sides extending in the second direction DR2 and short sides extending in the first direction DR1.

Protruding regions PTR1, PTR2, PTR3, and PTR4 may be defined in an edge region of the first substrate 200 and the second substrate 300 of the region where the first substrate 200 and the second substrate 300 of the display device 10 are disposed to overlap each other, and a recessed region IDR may be defined in a region surrounded by the protruding regions PTR1, PTR2, PTR3, and PTR4 in a plan view. The recessed region IDR may be completely surrounded by the protruding regions PTR1, PTR2, PTR3, and PTR4 in a plan view.

A thickness or a surface height of the recessed region IDR may be smaller than a thickness or a surface height of each of the protruding regions PTR1, PTR2, PTR3, and PTR4.

A first protruding region PTR1 may substantially extend in the second direction DR2, may be disposed adjacent to the outer region PR, and may be positioned on a long side of an upper side in the first direction DR1 or a long side of one side in the first direction DR1 in the region where the first substrate 200 and the second substrate 300 of the display device 10 are disposed to overlap each other. A second protruding region PTR2 may substantially extend in the second direction DR2, may be positioned opposite to the first protruding region PTR1 disposed adjacent to the outer region PR (disposed to be spaced apart from the recessed region IDR), and may be positioned on a long side of a lower side in the first direction DR1 or a long side of the other side in the first direction DR1 in the region where the first substrate 200 and the second substrate 300 of the display device 10 are disposed to overlap each other. A third protruding region PTR3 may substantially extend in the first direction DR1, may connect the outer region PR and the second protruding region PTR2 in a plan view, and may be positioned on a short side of a left side in the second direction DR2 or a short side of one side in the second direction DR2 in the region where the first substrate 200 and the second substrate 300 of the display device 10 are disposed to overlap each other. A fourth protruding region PTR4 may substantially extend in the first direction DR1, may connect the outer region PR and the second protruding region PTR2 in a plan view, and may be positioned on a short side of a right side in the second direction DR2 or a short side of the other side in the second direction DR2 in the region where the first substrate 200 and the second substrate 300 of the display device 10 are disposed to overlap each other. Further, the fourth protruding region PTR4 may be positioned opposite to the third protruding region PTR3 (disposed to be spaced apart from the third protruding region PTR3 with the recessed region IDR interposed therebetween). The first protruding region PTR1 may be disposed between the third protruding region PTR3 and the fourth protruding region PTR4 in a plan view.

The first protruding region PTR1 may be plural. That is, each of the plurality of first protruding regions PTR1 may include 1-1 protruding regions PTR11 disposed adjacent to the third protruding region PTR3 and the fourth protruding region PTR4, and may include a 1-2 protruding region PTR12 disposed between the 1-1 protruding regions PTR11 disposed adjacent to the third protruding regions PTR3 and the fourth protruding region PTR4. Further, each of the 1-1 protruding regions PTR11 may include a 1-1-1 protruding region PTR111 disposed adjacent to the outer region PR in a plan view and a 1-1-2 protruding region PTR112 disposed between the 1-1-1 protruding region PTR111 and the recessed region IDR.

Referring to FIG. 2, in the outer region PR, the first substrate 200 may have a first thickness t1, and in the 1-1 protruding region PTR11, the first substrate 200 may have the first thickness t1, and the second substrate 300 may have a 5-1 thickness t51 and a 5-2 thickness t52. That is, the second substrate 300 may have the 5-1 thickness t51 in the 1-1-1 protruding region PTR111 of the 1-1 protruding region PTR11, and the second substrate 300 may have the 5-2 thickness t52 in the 1-1-2 protruding region PTR112. In the recessed region IDR, the first substrate 200 may have a fourth thickness t4, and the second substrate 300 may have a seventh thickness t7. In the second protruding region PTR2, the first substrate 200 may have a third thickness t3, and the second substrate 300 may have a sixth thickness t6.

Each of the first thickness t1 and the third thickness t3 may be greater than the fourth thickness t4 and may be substantially equal to each other. For example, the first thickness t1 and the third thickness t3 may be the same as each other.

The 5-1 thickness t51 may be greater than the 5-2 thickness t52 and the sixth thickness t6, and each of the 5-2 thickness t52 and the sixth thickness t6 may be greater than the seventh thickness t7. The 5-2 thickness t52 and the sixth thickness t6 may be, for example, the same as each other.

The first thickness t1 may be substantially the same as the 5-2 thickness t52. For example, the first thickness t1 may be the same as the 5-2 thickness t52. The third thickness t3 and the sixth thickness t6 may be substantially the same as each other. For example, the third thickness t3 and the sixth thickness t6 may be the same as each other.

In terms of a surface height, a surface height of the first substrate 200 may be the same in the outer region PR, the 1-1 protruding region PTR11, and the second protruding region PTR2, and surface heights of the outer region PR, the 1-1 protruding region PTR11, and the second protruding region PTR2 may be greater than a surface height of the recessed region IDR.

In addition, a surface height of the second substrate 300 may be the largest in the 1-1-1 protruding region PTR111, may be the second largest in the 1-1-2 protruding region PTR112 and the second protruding region PTR2, and may be the smallest in the recessed region IDR. The surface heights of the 1-1-2 protruding region PTR112 and the second protruding region PTR2 may be substantially the same as each other. For example, the surface heights of the 1-1-2 protruding region PTR112 and the second protruding region PTR2 may be the same as each other.

In terms of the overall thickness in the thickness direction of the display device 10, the thickness of the 1-1-1 protruding region PTR111 may be the largest, and the thicknesses of the 1-1-2 protruding region PTR112 and the second protruding region PTR2 may be the second largest, the thickness of the recessed region IDR may be the third largest, and the thickness of the outer region PR may be the smallest.

The thicknesses of the 1-1-2 protruding region PTR112 and the second protruding region PTR2 may be substantially the same as each other. For example, the thicknesses of the 1-1-2 protruding region PTR112 and the second protruding region PTR2 may be the same as each other.

Referring to FIG. 3, the first substrate 200 may have an eighth thickness t8 in the 1-2 protruding region PTR12, and the second substrate 300 may have a ninth thickness t9 in the 1-2 protruding region PTR12. The eighth thickness t8 may be substantially the same as the first thickness t1. For example, the eighth thickness t8 may be the same as the first thickness t1.

The ninth thickness t9 may be substantially the same as the sixth thickness t6. For example, the ninth thickness t9 may be the same as the sixth thickness t6.

In terms of the surface height, a surface height of the first substrate 200 in the 1-2 protruding region PTR12 may be the same as a surface height of the first substrate 200 in the outer region PR, and a surface height of the second substrate 300 in the 1-2 protruding region PTR12 may be the same as a surface height of the second substrate 300 in the second protruding region PTR2.

In terms of the overall thickness in the thickness direction of the display device 10, a thickness of the display device 10 in the 1-2 protruding region PTR12 may be the same as a thickness of the display device 10 in the second protruding region PTR2.

Referring to FIGS. 4 and 5, the first substrate 200 may have a tenth thickness t10 and an eleventh thickness t11 in the third protruding region PTR3 and the fourth protruding region PTR4, respectively. The tenth thickness t10 and the eleventh thickness t11 may be the same as each other.

The second substrate 300 may have a twelfth thickness t12 and a thirteenth thickness t13 in the third protruding region PTR3 and the fourth protruding region PTR4, respectively. The twelfth thickness t12 and the thirteenth thickness t13 may be the same as each other. The tenth thickness t10 may be greater than the first thickness t1, and the twelfth thickness t12 may be the same as the 5-1 thickness t51.

Therefore, in terms of the surface height, a surface height of the first substrate 200 in the third protruding region PTR3 and a surface height of the first substrate 200 in the fourth protruding region PTR4 may be the same as each other, may be greater than a surface height in the 1-1 protruding region PTR11.

Similarly, a surface height of the second substrate 300 in the third protruding region PTR3 and a surface height of the second substrate 300 in the fourth protruding region PTR4 may be the same as each other, and may be greater than a surface height in the 1-1 protruding region PTR11.

In terms of the overall thickness in the thickness direction of the display device 10, thicknesses of the third protruding region PTR3 and the fourth protruding region PTR4 may be greater than a thickness of the 1-1 protruding region PTR11.

According to the curved display device according to the exemplary embodiment, the 1-1 protruding region PT11 may be formed of protrusions having different thicknesses and different surface heights. The protrusions may include the 1-1-1 protruding region PTR111 and the 1-1-2 protruding region PTR112 described above.

As described above, the curved display device may be formed in a structure in which the long sides are curved while the short sides are maintained, and the 1-1 protruding region PTR11 and the second protruding region PTR2 may correspond to the long side of one side of the display device 10 in the first direction DR1 and the long side of the other side of the display device 10 in the first direction DR1, respectively, and thus correspond to bent regions.

Meanwhile, different thicknesses and surface heights of the display device 10 may be formed through an etching process. The etching process may be performed through an etchant in an upper direction of the display device 10 in a state in which the display device 10 is erected (a state in which the long side of one side in the first direction DR1 is disposed in an upward direction and the long side of the other side in the first direction DR1 is disposed in a downward direction). A masking process may be performed in an unetched region before the etching process of the display device 10 is performed. The masking process may be performed through an operation of disposing a masking member in a non-etched region of the display device 10. The masking member may mask the outer region PR, the driving connecting film 410, and the driving circuit board 420 of the display device 10 to prevent the driving connecting film 410 and the driving circuit board 420 from being damaged by an etchant. Further, the masking member may also mask the upper surface of the second substrate 300 disposed in the 1-1-1 protruding region PTR111. When the masking member does not mask the second substrate 300 disposed in the 1-1 protruding region PTR11, there may be a risk that the driving connection film 410 and the driving circuit board 420 are damaged by the etchant applied to the 1-1 protruding region PTR11. However, in addition to the 1-1-1 protruding region PTR111, the 1-1-2 protruding region PTR112 is etched without masking, thereby reducing bending stress when the display device 10 is curved. Furthermore, the bending stress when the display device 10 is curved may be reduced by not masking the 1-2 protruding region PTR12 positioned between the plurality of 1-1 protruding regions PTR11.

Hereinafter, a method of fabricating the above-described display device according to the exemplary embodiments will be described. In the following exemplary embodiments, descriptions of the same components as those of the previously described exemplary embodiments will be omitted or simplified, and differences will be mainly described.

FIGS. 9 to 12 are cross-sectional views sequentially illustrating a part of a fabricating process of a display device.

Figure 9:
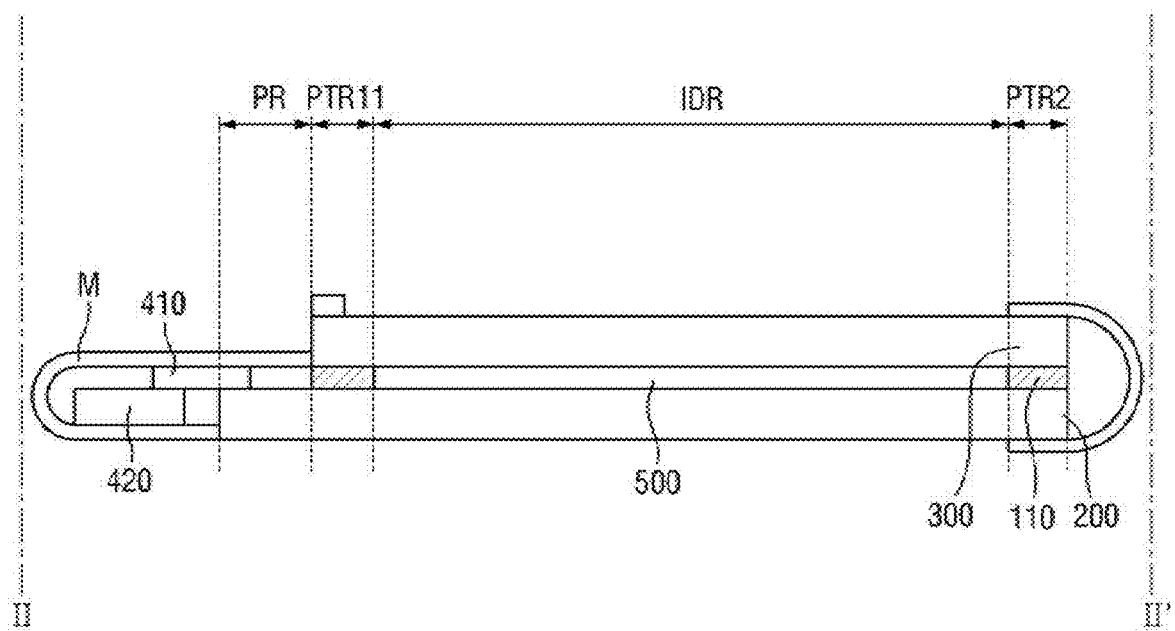
FIGS. 9 to 12 are cross-sectional views sequentially illustrating a part of a fabricating process of a display device.
Figure 10:
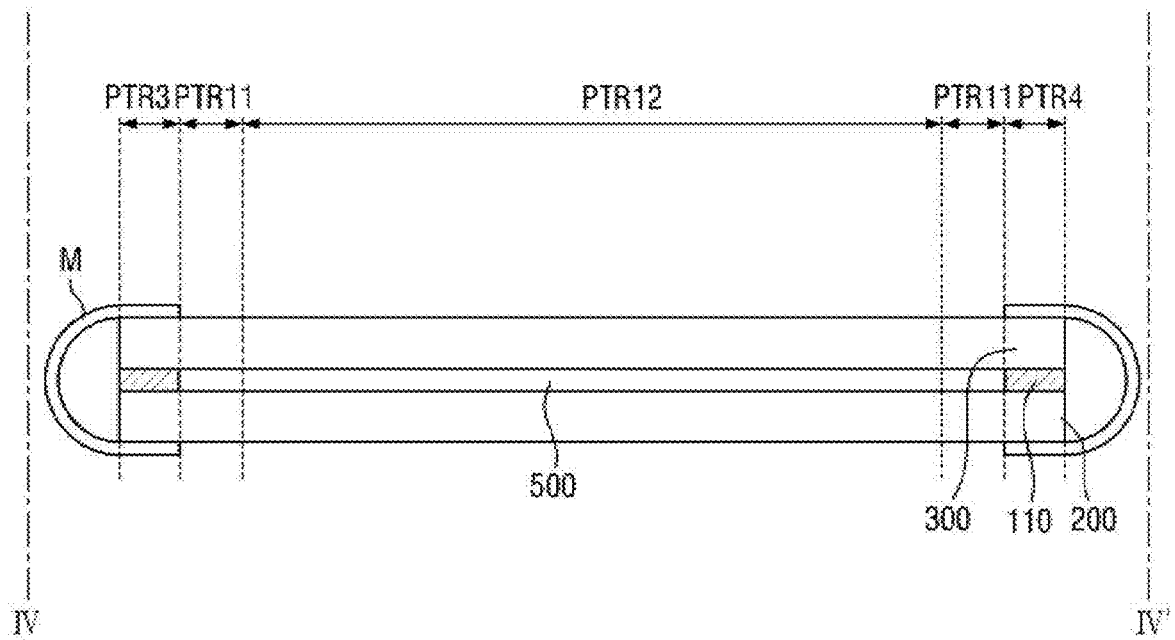

First, referring to FIGS. 2 and 4 along with FIGS. 9 and 10, a method of fabricating the display device according to an exemplary embodiment includes an operation of preparing a first substrate 200 having an overall uniform thickness, a second substrate 300 having an overall uniform thickness, a sealing member 110 on edges of the first substrate 200 and the second substrate 300, a liquid crystal layer 500 disposed between the first substrate 200 and the second substrate 300, a driving connecting film 410 attached to an outer region PR of the first substrate 200, and a driving circuit board 420 connected to the driving connecting film 410.

Unlike the first substrate 200 and the second substrate 300 according to the exemplary embodiments of FIGS. 2 and 4, the first substrate 200 and the second substrate 300 may be substrates having an overall uniform thickness and may be substrates that have not been etched yet.

Subsequently, referring to FIGS. 9 and 10, a primary non-etched region of the display device is masked. The primary non-etched region may include the first substrate 200 in the outer region PR, the first substrate 200 and the second substrate 300 in a second protruding region PTR2, the second substrate 300 of a 1-1 protruding region PTR11 (referring to a 1-1-1 protruding region PTR111), the first substrate 200 and the second substrate 300 of a third protruding region PTR3, and the first substrate 200 and the second substrate 300 of a fourth protruding region PTR4. The masking operation may be performed by disposing a masking member M in the primary non-etched region. The masking member M may be formed in an envelope shape with an open end and installed in a form of a cover so as to cover a portion in which the primary non-etched region is formed. As another example, the masking member M may be configured in a film form and may be pasted over from one surface to the other surface. An acid-resistant adhesive tape (not shown) may be installed on an edge of the masking member M so as to easily attach the masking member M to the outer surface of the display device, and when the masking member M is configured in the film form and pasted over, the masking member M may be configured to prevent penetration of an etchant by attaching the pasted both ends with an acid-resistant adhesive tape or by thermal fusion. The masking member M itself may be formed of an adhesive tape.

Subsequently, a primary etching is performed. The primary etching may be wet etching. As another example, the primary etching may be dry etching. In the primary etching, an etchant may be applied to or sprayed on the display device, and the configuration of the display device may be etched except for the primary non-etched region. Therefore, except for the first substrate 200 of the outer region PR, the first substrate 200 and the second substrate 300 of the second protruding region PTR2, the second substrate 300 of the 1-1 protruding region PTR11 (referring to the 1-1-1 protruding region PTR111), the first substrate 200 and the second substrate 300 of the third protruding region PTR3, and the first substrate 200 and the second substrate 300 of the fourth protruding region PTR4 that are included in the primary non-etched region, the display device may be etched so that the overall thickness thereof can be reduced. That is, a thickness of the primary non-etched region can be maintained by the masking member M, and the thickness of the primary non-etched region can be reduced overall.

Figure 11:
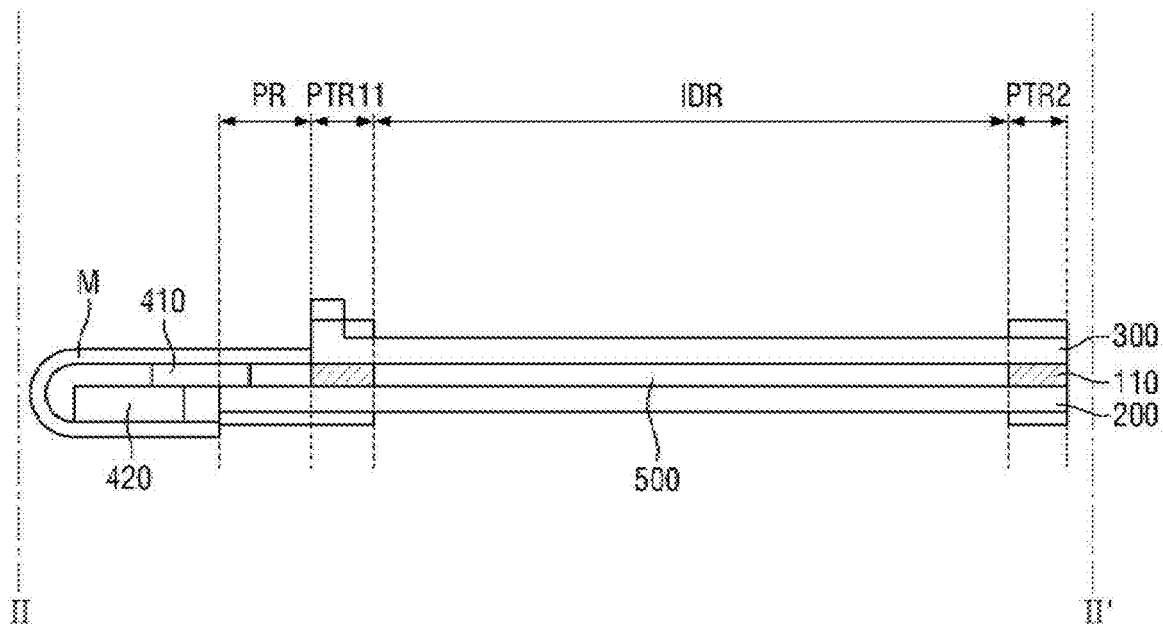
Figure 12:
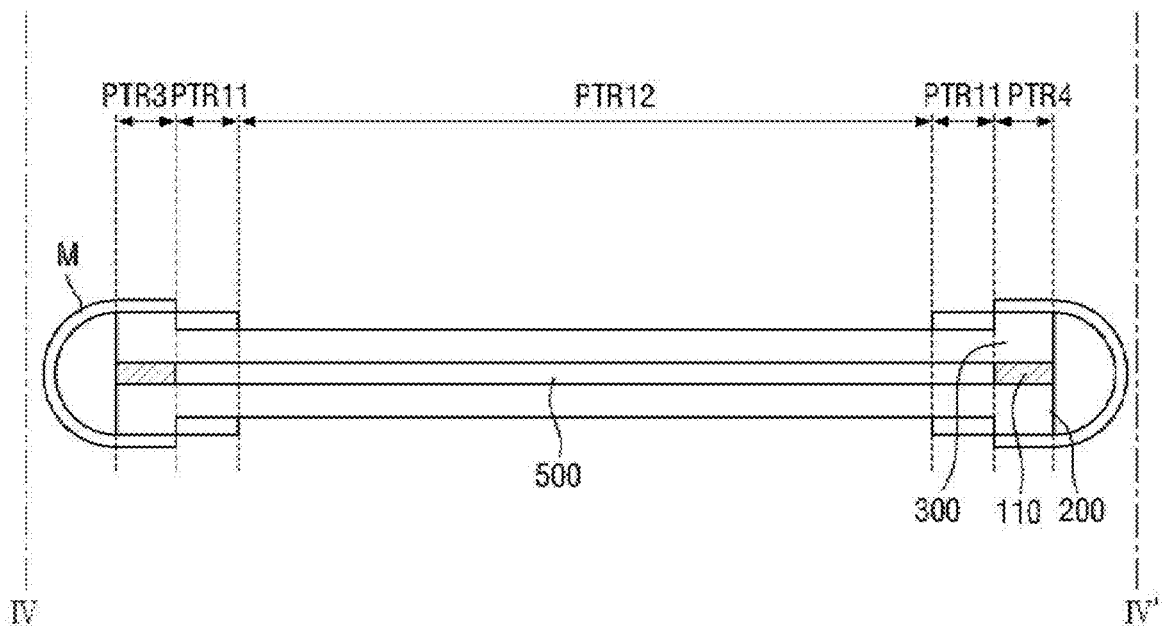

Subsequently, referring to FIGS. 11 and 12, a secondary non-etched region of the display device is masked. The secondary non-etched region may include the first substrate 200 of the outer region PR, the first substrate 200 and the second substrate 300 of the second protruding region PTR2, the first substrate 200 and the second substrate 300 of the 1-1 protruding region PTR11 (including the 1-1-1 protruding region PTR111 and the 1-1-2 protruding region PTR112), the first substrate 200 and the second substrate 300 of the third protruding region PTR3, and the first substrate 200 and the second substrate 300 of the fourth protruding region PTR4. The masking operation may be performed by disposing the masking member M in the secondary non-etched region. The masking member M may be formed in an envelope shape with an open end and installed in a form of a cover so as to cover a portion in which the secondary non-etched region is formed. As another example, the masking member M may be configured in a film form and may be pasted over from one surface to the other surface. An acid-resistant adhesive tape (not shown) may be installed on an edge of the masking member M so as to easily attach the masking member M to the outer surface of the display device, and when the masking member M is configured in the film form and pasted over, the masking member M may be configured to prevent penetration of the etchant by attaching the pasted both ends with an acid-resistant adhesive tape or by thermal fusion. The masking member M itself may be formed of an adhesive tape.

Subsequently, a secondary etching is performed. The secondary etching may be wet etching. As another example, the second etching may be dry etching. In the secondary etching, an etchant may be applied to or sprayed on the display device, and the configuration of the display device may be etched except for the secondary non-etched region. Therefore, except for the first substrate 200 of the outer region PR, the first substrate 200 and the second substrate 300 of the second protruding region PTR2, the second substrate 300 and the first substrate 200 of the 1-1 protruding region PTR11 (including the 1-1-1 protruding region PTR111 and the 1-1-2 protruding region PTR112), the first substrate 200 and the second substrate 300 of the third protruding region PTR3, and the first substrate 200 and the second substrate 300 of the fourth protruding region PTR4 that are included in the secondary non-etched region, the display device may be etched so that the overall thickness thereof can be reduced. That is, a thickness of the secondary non-etched region can be maintained by the masking member M, and the thickness of the secondary non-etched region can be reduced overall.

As described above, the masking member M may mask the outer region PR, the driving connecting film 410, and the driving circuit board 420 of the display device 10 to prevent the driving connecting film 410 and the driving circuit board 420 from being damaged by the etchant. Further, the masking member M may also mask an upper surface of the second substrate 300 disposed in the 1-1-1 protruding region PTR111. When the masking member does not mask the second substrate 300 disposed in the 1-1 protruding region PTR11, there can be a risk that the driving connection film 410 and the driving circuit board 420 are damaged by the etchant applied to the 1-1 protruding region PTR11. However, the 1-1-2 protruding region PTR112 other than the 1-1-1 protruding region PTR111 is not masked and thus is etched, thereby reducing bending stress when the display device 10 is curved. Furthermore, the bending stress when the display device 10 is curved can be reduced by not masking the 1-2 protruding region PTR12 positioned between the plurality of 1-1 protruding regions PTR11.

Embodiments of the present invention have been described with reference to the accompanying drawings, but it will be understood by those of skill in the art that various changes in form and details may be made without departing from the spirit and scope of the present invention as set forth in the following claims. Therefore, it should be construed that the exemplary embodiments described above are exemplary in all respects and are not limiting.

DESCRIPTION OF REFERENCE NUMERALS

110: Sealing member
200: First substrate
300: Second substrate
410: Driving connection film
420: Driving circuit board
500: Liquid crystal layer
M: Masking member

The invention claimed is:

1. A display device comprising:
an upper substrate; and
a lower substrate disposed on a lower portion of the upper substrate and including an outer region extending outward from the upper substrate at one side,
wherein each of the upper substrate and the lower substrate includes a protruding region extending along an edge of each of the upper substrate and the lower substrate, and
a recessed region surrounded by the protruding region in a plan view and having a thickness smaller than that of the protruding region,
wherein the protruding region includes a first protruding region that is adjacent to the outer region and extends in a first direction, a second protruding region that extends in the first direction and is positioned opposite to the first protruding region, a third protruding region that extends in a second direction intersecting the first direction and connects the first protruding region and the second protruding region, and a fourth protruding region that extends in the second direction and is positioned opposite to the third protruding region,
wherein the first protruding region includes a 1-1 protruding region, and the 1-1 protruding region includes a 1-1-1 protruding region and a 1-1-2 protruding region disposed between the 1-1-1 protruding region and the recessed region and having a thickness between a thickness of the 1-1-1 protruding region and the thickness of the recessed region, and
wherein the first protruding region further includes a 1-2 protruding region disposed between the 1-1 protruding region disposed adjacent to the third protruding region and the 1-1 protruding region disposed adjacent to the fourth protruding region, wherein a thickness of the 1-2 protruding region is smaller than the thickness of the 1-1-1 protruding region.

2. The display device of claim 1, wherein the upper substrate includes a color filter substrate, and the lower substrate includes a thin film transistor substrate.

3. The display device of claim 1, further comprising a flexible film attached on the outer region and a main circuit board connected to the flexible film,
wherein the flexible film is plural, and the plurality of flexible films are arranged in the first direction.

4. The display device of claim 1, wherein the 1-1 protruding region is disposed adjacent to the third protruding region.

5. The display device of claim 4, wherein the 1-1 protruding region is further disposed adjacent to the fourth protruding region.

6. The display device of claim 1, wherein, in the 1-1-1 protruding region, a thickness of the upper substrate is greater than a thickness of the lower substrate.

7. The display device of claim 6, wherein, in the 1-1-2 protruding region, the thickness of the upper substrate is substantially the same as the thickness of the lower substrate.

8. The display device of claim 7, wherein the thickness of the lower substrate in the 1-1-1 protruding region is the same as the thickness of the lower substrate in the 1-1-2 protruding region.

9. The display device of claim 1, wherein a thickness of the first protruding region is smaller than a thickness of the third protruding region and a thickness of the fourth protruding region.

10. The display device of claim 9, wherein a thickness of the second protruding region is smaller than the thickness of the third protruding region and the thickness of the fourth protruding region.

11. A display device comprising:
a color filter substrate; and
a thin film transistor substrate disposed on a lower portion of the color filter substrate and including an outer region extending outward from the color filter substrate at one side,
wherein each of the color filter substrate and the thin film transistor substrate includes a protruding region extending along an edge of each of the color filter substrate and the thin film transistor substrate, and
a recessed region surrounded by the protruding region in a plan view and having a thickness smaller than that of the protruding region,
wherein the protruding region includes a first protruding region that is adjacent to the outer region and extends in a first direction, a second protruding region that extends in the first direction and is positioned opposite to the first protruding region, a third protruding region that extends in a second direction intersecting the first direction and connects the first protruding region and the second protruding region, and a fourth protruding region that extends in the second direction and is positioned opposite to the third protruding region, wherein the first protruding region includes a plurality of protrusions having different surface heights from each other, and wherein the first protruding region further includes a 1-2 protruding region disposed between the 1-1 protruding region disposed adjacent to the third protruding region and the 1-1 protruding region disposed adjacent to the fourth protruding region, wherein a thickness of the 1-2 protruding region is smaller than a thickness of the 1-1-1 protruding region, and in the 1-1-1 protruding region, a thickness of the color filter substrate is greater than a thickness of the thin film transistor substrate.

12. The display device of claim 11, wherein the plurality of protrusions includes a 1-1 protruding region, wherein the 1-1 protruding region includes a 1-1-1 protruding region and a 1-1-2 protruding region disposed between the 1-1-1 protruding region and the recessed region and having a surface height between a surface height of the 1-1-1 protruding region and a surface height of the recessed region.

13. The display device of claim 12, wherein the 1-1 protruding region is disposed adjacent to the third protruding region and the fourth protruding region.

* * * * *